(12) United States Patent
Hoshi

(10) Patent No.: US 6,534,240 B1
(45) Date of Patent: Mar. 18, 2003

(54) METHOD OF PRODUCING LITHOGRAPHIC PRINTING PLATE, LITHOGRAPHIC PRINTING PLATE PRECURSOR AND METHOD OF FORMING IMAGES

(75) Inventor: Satoshi Hoshi, Shizuoka (JP)

(73) Assignee: Fuji Photo Film Co., Ltd., Minami-Ashigara (JP)

(*) Notice: Subject to any disclaimer, the term of this patent is extended or adjusted under 35 U.S.C. 154(b) by 0 days.

(21) Appl. No.: 09/598,393

(22) Filed: Jun. 21, 2000

(30) Foreign Application Priority Data

Jul. 5, 1999 (JP) .......................... 11-190786

(51) Int. Cl.$^7$ ................................ G03F 7/09
(52) U.S. Cl. .................. 430/302; 430/19; 430/947; 430/322; 101/453; 101/456
(58) Field of Search ................ 430/300, 302, 430/322, 947; 101/453, 454, 465, 456

(56) References Cited

U.S. PATENT DOCUMENTS

| | | | | |
|---|---|---|---|---|
| 3,640,717 A | * | 2/1972 | Gallet et al. ............... | 96/1 |
| 3,652,276 A | * | 3/1972 | Bartlett et al. .............. | 96/48 |
| 3,736,872 A | * | 6/1973 | Martens et al. ............. | 101/462 |
| 3,804,623 A | * | 4/1974 | French ....................... | 96/47 |
| 6,048,654 A | * | 4/2000 | Nakayama et al. ......... | 430/19 |
| 6,082,263 A | * | 7/2000 | Koguchi et al. ............ | 101/456 |
| 6,096,471 A | * | 8/2000 | Van Damme et al. ...... | 430/188 |
| 6,171,748 B1 | * | 1/2001 | Tanaka et al. .............. | 430/138 |
| 6,258,512 B1 | * | 7/2001 | Kasai et al. ................ | 430/302 |
| 6,420,091 B1 | * | 7/2002 | Nakayama et al. ......... | 430/302 |

FOREIGN PATENT DOCUMENTS

| | | | | |
|---|---|---|---|---|
| JP | 2001092116 A | * | 4/2001 | ............. G03F/7/00 |

* cited by examiner

*Primary Examiner*—Janet Baxter
*Assistant Examiner*—Yvette C. Thornton
(74) *Attorney, Agent, or Firm*—Burns, Doane, Swecker & Mathis, LLP

(57) ABSTRACT

A method of producing a lithographic printing plate comprising a step of providing on a support a layer has a hydrophobic surface and comprises an oxidizable material and a reducible material, a step of irradiating imagewise with active rays in the presence of a photocatalytic metal compound, wherein the oxidizable material in the irradiated area is decomposed imagewise to convert the layer surface in the irradiated area surface into hydrophilic property and form an imagewise distribution of hydrophilic areas and hydrophobic areas: and a lithographic printing plate precursor used in the aforesaid method. In accordance with this method, no development-processing is required for plate-making, the plate-making operations can be carried out as the plate precursor is mounted on a printing press, and the lithographic printing plate made can have an excellent press life and hardly generates staining.

2 Claims, 1 Drawing Sheet

(a)

(b)

METHOD OF PRODUCING LITHOGRAPHIC PRINTING PLATE, LITHOGRAPHIC PRINTING PLATE PRECURSOR AND METHOD OF FORMING IMAGES

FIELD OF THE INVENTION

The present invention relates to a method of producing a photosensitive lithographic printing plate, which requires no development processing and provides a printing plate having an excellent press life, and to a lithographic printing plate precursor used therein. More specifically, the invention relates to a method of producing a lithographic printing plate, by which the plate-making can be simply performed without development processing, the lithographic printing plate made can be directly mounted on a printing machine as it is to undergo printing operations and the plate-making can be achieved with a printing machine, and with a printing plate precursor used in such a plate-making method.

BACKGROUND OF THE INVENTION

In general the lithographic printing plate has a lipophilic image area capable of accepting ink during the printing process and a hydrophilic non-image area capable of accepting a fountain solution. As a precursor of such a lithographic printing plate, the presensitized plate (i.e., the PS plate) having a lipophilic photopolymer layer on a hydrophilic support has so far been used widely. The plate-making method generally applied thereto comprises exposing the presensitized plate to light via images, such as a lith film, and then removing the non-image area by dissolving it in a developer. The desired printing plate is obtained using such a plate-making method.

In the plate-making process of the conventional presensitized plates, a step of dissolving and removing non-image areas after an exposure operation is required. Making such an additional wet processing unnecessary or simple is one of the subjects of desired improvements in the prior art. Recently in particular, the disposal of liquid wastes discharged with the progress of wet processing has become a great concern in the industrial world from the viewpoint of consideration for the global environment. Therefore, the request for improvement in this respect has become stronger and stronger.

The method as one of simple plate-making methods which comprises utilizing an image recording layer which makes it possible to remove the non-image areas of a printing plate precursor during the general printing process, and carrying out development on a printing machine after exposure, thereby obtaining the final printing plate, is proposed. The system for making a lithographic printing plate according to the aforementioned method is referred to as a "on-press development" system. As a specific example thereof, mention may be made of a method in which the image recording layer soluble in a fountain solution or an ink solvent is employed and the non-image areas is removed mechanically by contact with the impression cylinder or the blanket cylinder installed in a printing machine. However, the on-press development system has a great problem that the non-image area component of the image recording layer imparts a danger of impairing printing quality, e.g., printing stain, when removed from the printing plate precursor by dissolution action or mechanical contact.

The plate-making technique which has lately drawn considerable attention as another trend in this field is a computer-to-plate technique wherein the digitized image information is carried on highly converging radiant rays, such as laser beams and the scanning exposure with these radiant rays are given to a plate precursor, thereby directly making the printing plate without exposure through a lith film. The direct plate-making technique of this type is expected to have good effects upon simplification, labor saving and speed-up of plate-making and printing procedures. In the rapid plate-making for images with gradation, however, the scanning exposure with laser beams is at a disadvantage by requiring much labor, cost and time. Therefore, it is desired to develop a plate-making method which not only enables the recording of images by an areal exposure system suitable for plate-making of gradation images but also has simplicity and rapidity equivalent to those in making printing plates by the computer-to-plate system using laser beams.

As a means to meet such a requirement, attempts to utilize the photoresponse characteristics of photocatalytic substances for plate-making have been made. For instance, JP-A-9-131914 (the term "JP-A" as used herein means an "unexamined published Japanese patent application") discloses the method in which the coating film of a hydrophobic substance formed on the surface of a photocatalytic substance is irradiated with active rays (or active light) to be converted into a hydrophilic substance in the irradiated area; as a result, hydrophilic areas and hydrophobic areas are distributed imagewise to make a printing plate. Similarly to the above reference, JP-A-10-35131 also discloses that the hydrophobic adsorption film formed on the surface of, e.g., silicone resin, silica or alumina undergoes polarity conversion by irradiation with active rays to form imagewise distribution of hydrophilic and hydrophobic areas, thereby making a printing plate. In addition, World Patent Application WO99/08158 also discloses the method in which the polarity conversion of photocatalytic substances by irradiation with light is utilized for lithography. These conventional arts are all inferior in sensitivity, so that a great irradiation amount of light is required for the polarity conversion and this requirement imposes a restriction upon the practical use of the foregoing conventional arts. Accordingly, it is necessary to improve the sensitivity on condition that photocatalytic substances are employed.

SUMMARY OF THE INVENTION

An object of the invention is to meet the present-day needs for reduction of environmental impacts in the field of the plate-making and answer to the market request of not only making it possible to record images by areal exposure but also to realize the simplicity on the same level as the drawing system by laser scanning has. More specifically, the object of the invention is to provide a method of making a lithographic printing plate wherein no development processing is required, the plate-making can be performed by simple operations or as the printing plate precursor is directly mounted on a printing machine, the staining on the printing plate surface is reduced and the areal exposure can be adopted for recording images, and to provide a printing plate precursor used therein.

As a result of our investigations made into various material systems capable of producing a phenomenon of polarity conversion from hydrophilicity into hydrophobicity by irradiation of light with the intention of solving the aforementioned problems, it has been found that there were combinations of materials undergoing mutual reaction by the action of photocatalysts to convert their polarity among the systems wherein compounds susceptible to reduction, such as the salts of metals having a weak ionization tendency, and compounds susceptible to oxidation, such as organic compounds having hydroxyl or carboxyl groups, are present together. By further studies based on this finding, the invention has come to be achieved.

Specifically, embodiments of the invention are as follows:

1. A method of producing a lithographic printing plate; comprising
    a step of providing on a support a layer that has a hydrophobic surface and comprises an oxidizable material and a reducible material, and
    a step of irradiating imagewise with active rays in the presence of a photocatalytic metal compound, wherein the oxidizable material in the irradiated area is decomposed imagewise to convert the layer surface in the irradiated area surface into hydrophilic property and form an imagewise distribution of hydrophilic areas and hydrophobic areas.
2. The method of producing a lithographic printing plate as described in the above item 1, wherein the photocatalytic metal compound is dispersed in the state of grains in the layer comprising an oxidizable material and a reducible material or provided in the form of a thin film so as to be in contact with the layer comprising an oxidizable material and a reducible material.
3. The method of producing a lithographic printing plate as described in the above item 1 or 2, wherein the reducible material is a salt of a metal element situated behind hydrogen in the order of ionization tendency.
4. A lithographic printing plate precursor, comprising a support having thereon a layer that has a hydrophobic surface and comprises an oxidizable material and a reducible material and; when the layer is irradiated imagewise to active rays in the presence of a photocatalytic metal compound, forming an imagewise distribution of hydrophilic areas and hydrophobic areas by the conversion of the irradiated area surface into hydrophilic property through the imagewise removal of the oxidizable material in the irradiated area.
5. A method of forming images, comprising imagewise irradiating a layer comprising an oxidizable material and a reducible material with active rays in the presence of a photocatalytic metal compound, and decomposing imagewise the oxidizable material in the irradiated area to convert the irradiated area surface into hydrophilic property and form imagewise distribution of hydrophilic areas and hydrophobic areas.

A primary feature of the invention is that to the making of a printing plate is applied a newly found phenomenon that, when the material system comprising an oxidizable material (i.e., a material which is oxidized), a reducible material (i.e., a material which is reduced) and grains of a photocatalytic metal compound is irradiated with active rays, the redox reaction is caused between the oxidizable material and the reducible material to result in the polarity conversion of the material system from hydrophobicity (i.e., hydrophobic property) into hydrophilicity (i.e., hydrophilic property). Moreover, the polarity conversion proceeds efficiently owing to the presence of the reducible material in this material system, so that the effective speed of light irradiation is high. Therefore, this material system can have a practical sensitivity.

Figure 1:
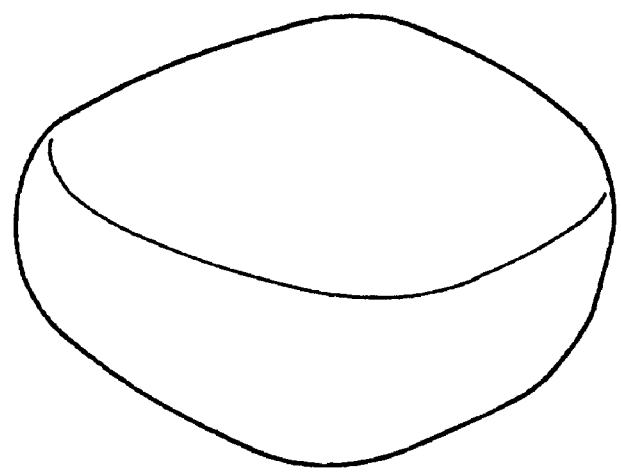
FIG. 1 is a schematic view illustrating the printing method of the present invention utilizing a photocatalytic metal compound.
Figure 1:
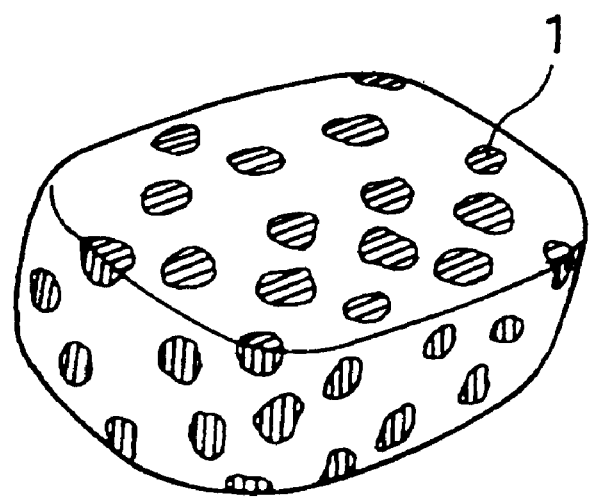

The drawing (a) is an oblique view of one of titanium oxide grains as sensitive body dispersed in the photosensitive layer of the printing plate precursor of the present invention.

The drawing (b) is an oblique view of a titanium oxide grain in the printing plate, which is rendered receptive of ink by carrying metal fine pieces reductively deposited from a reducible metal salt which undergoes imagewise exposure.

Therein, the symbol "1" represents metal specks reductively deposited from a reducible metal salt.

DETAILED DESCRIPTION OF THE INVENTION

The application of the aforementioned phenomenon to the plate-making is illustrated below in more detail.

FIG. 1 is a schematic view illustrating the method of making a printing plate in accordance with the invention, wherein titanium oxide grains are used as an example of the compound having a photocatalytic action. Around each of the titanium oxide grains, though not drawn in the figure, the titanium oxide grains are dispersed in polyvinyl alcohol which is an oxidizable material as a dispersion medium. In this dispersion medium, silver nitrate as a reducible material is further contained uniformly in a dissolved state. FIG. 1*a* shows the state that each titanium oxide grain having a photocatalytic action is in before imagewise exposure. In this figure is drawn neither polyvinyl alcohol as a dispersion medium nor silver nitrate dissolved therein. FIG. 1*b* is an illustration showing a change caused in the foregoing three-material system by active-ray irradiation, and draws the state that the silver nitrate is reduced through the photocatalytic action to deposit the fine pieces of metal silver (the symbol "1" in FIG. 1*b*) on the titanium oxide grain surf ace. While the silver nitrate undergoes photo-reduction, the polyvinyl alcohol undergoes photo-oxidation so as to be decomposed. And it is thought that the polyvinyl alcohol decreases with an increase in irradiation and removed in the end. The metal silver-deposited grain surface is rough, and even thereby it changes into a significantly hydrophilic surface. By the decomposition and the removal of polyvinyl alcohol, the grain surface becomes further hydrophilic. Thus, the layer comprising the three-material system mentioned above becomes greatly hydrophilic. In other words, imagewise distribution of ink-receptive hydrophobic areas and ink-repulsive hydrophilic areas is formed.

Instead of the foregoing printing method wherein the imagewise distribution of hydrophobic areas and hydrophilic areas is utilized as an imagewise distribution of ink-receptive areas and ink-repulsive areas, the imagewise distribution of hydrophobic areas and hydrophilic areas can be converted into an imagewise distribution of another image forming material, and thereby the present method can also be adopted as a simple method for image formation.

For instance, the imagewise distribution of a black image material is formed by the reduction of a reducible material, such as a metal salt, and thereby a simple lith film original is made by a dry process. Also the present method can be applied to various image forming methods, e.g., the formation of a color filter or a micro lens by the adhesion of a colored resin solution or an ultraviolet curable resin in the desired pattern.

In the case of illustration by the figure, the metal compound having photocatalytic properties is titanium oxide in a grained state, and present in a state that the grains thereof are dispersed in a photosensitive layer. Besides titanium oxide, however, any compounds may be used in the invention as far as they can function as a photocatalyst in the redox reaction. For instance, zinc oxide is also used to advantage. Further, it is not necessary for the photocatalytic metal compound to be incorporated as a grain dispersion in the photosensitive layer, but the photocatalytic metal compound may be formed into a thin film on a support by the use of a vapor deposition, ion plating, sputtering or coating-and-burning technique and the thin film may be in contact with the layer containing an oxidizable material and a reducible material.

On the other hand, the oxidizable material is polyvinyl alcohol in the FIG. 1, but it is not necessarily required to be a high molecular compound. Suitable examples of an oxidizable material include compounds having hydroxyl groups, carboxyl groups, amino groups, amido groups, sulfonamido groups, formyl groups, carbonyl groups, ester linkages, ether linkages, urethane linkages or urea linkages, which may have either high molecular weight or low molecular weight.

Of reducible materials, as described above in the above item 3, the salts of metals situated behind hydrogen in the order of ionization tendency (or noble metals) are preferred over the others.

In addition, it is also desirable that the grains having no photocatalytic activity be contained as second component grains in the layer having a hydrophobic surface and comprising an oxidizable material and a reducible material to modify the polarity so that the resultant imagewise distribution of hydrophobic areas and hydrophilic areas is optimized. Suitable examples of a second component grains having no photocatalytic activity include silica grains, alumina grains, titanium nitride grains, silicon nitride grains and aluminum nitride grains.

Specific embodiments for carrying out the invention are illustrated below in detail.

First, various constituent materials and plate-making processes employed for the plate-making method and the printing plate precursor are illustrated in detail.

Image Recording Layer

In the following descriptions, the image recording layer is also referred to as "a photosensitive layer" depending on the subject of the description. To begin with, the individual constituent materials of a photosensitive layer are described.
(Metal compound grains having photocatalytic properties)

The metal compounds having photocatalytic properties are metal compounds whose electron energies are excited by active ray irradiation to increase their reaction activities. The rays or light capable of inducing excitation of electrons into higher energy levels are active rays. Suitable examples of a metal compound having photocatalytic properties which can be used in the invention include $TiO_2$, $RTiO_3$ (wherein R is an alkaline earth metal atom), $AB_{2-x}C_xD_{3-x}E_xO_{10}$ (wherein A is a hydrogen or alkali metal atom, B is an alkaline earth metal or lead atom, C is a rare earth metal atom, D is a metal atom belonging to the group 5A in the periodic table, E is a metal atom belonging to the group 4, and x is an arbitrary figure of from 0 to 2), $SnO_2$, $ZrO_2$, ZnO, ZnS, CdS, PbS, SiC, $WO_3$, CdSe, MoSe, $MoSe_2$, $Bi_2O_2$ and $Fe_2O_3$.

As to the titanium oxide ($TiO_2$), the products manufactured by any of known methods, e.g., by subjecting ilmenite or titanium slag to heating in sulfuric acid and then burning, or to chlorination under heating and then oxidation with oxygen, can be used in the invention. The titanium oxide used may have any crystal structure. However, the use of anatase-type titanium dioxide is preferable because of its high sensitivity. It is well known that the anatase-type crystals can be obtained by properly choosing the burning condition during the burning process for manufacturing titanium dioxide. Therein, amorphous titanium oxide and rutile-type titanium dioxide may be present together, but the suitable proportion of anatase-type titanium dioxide in such products is at least 40%, preferably at least 60%, for the reason mentioned above.

R of $RTiO_3$ is a metal atom belonging to a group of alkaline earth elements in the periodic table, such as magnesium, calcium, strontium, barium and beryllium. In particular, strontium and barium are preferred as R. Two or more of alkaline earth metal atoms can be present together in R so long as the total thereof is consistent stoichiometrically with the foregoing formula.

A in the compounds represented by formula $AB_{2-x}C_xD_{3-x}E_xO_{10}$ is a monovalent atom selected from alkali metal atoms, such as hydrogen, sodium, potassium, rubidium, cesium and lithium. Two or more of these alkali metal atoms may be present together in A so long as the total thereof is consistent stoichiometrically with the foregoing formula.

B is an alkaline earth metal atom having the same meaning as given for R, or a lead atom. Similarly to the above, two or more of those metal atoms may be present together in B as long as the stoichiometrical consistency is kept.

C is a rare earth atom, preferably scandium, yttrium or a lanthanide element, such as cerium, praseodymium, neodymium, holmium, europium, gadolinium, terbium, thulium, ytterbium or lutetium. And two or more of these rare earth elements may be present together in C as long as the stoichiometrical consistency is kept.

D is at least one element selected from the group 5A elements in the periodic table, such as vanadium, niobium or tantalum. And two or more of the group 5A elements may be present together in D so long as the stoichiometrical relation holds.

E is a metal atom belonging to the group 4, such as silicon, germanium, tin, lead, titanium or zirconium, and two or more of the group 4 metal atoms may be present together in E.

x is an arbitrary figure ranging from 0 to 2.

Suitable examples of a compound represented by formula $AB_{2-x}C_xD_{3-x}E_xO_{10}$ include $CsLa_2NbTi_2O_{10}$, $HCa_{1.5}La_{0.5}Nb_{2.5}Ti_{0.5}O_{10}$ and $LaNbTi_2O_{10}$.

To give an example of the method of producing fine grains of the compound as recited above, fine grains of $CsLa_2NbTi_2O_{10}$ can be produced by placing $Cs_2CO_3$, $La_2O_3$ and $NbO_5$ and $TiO_2$ in their respective stoichiometrical amounts in a mortar, grinding them to a fine powder, burning the fine powder in a platinum crucible at 130° C. for 5 hours, placing the burned matter in a mortar after cooling, and then grinding it to fine grains having a size of no greater than several microns. This production method can be applied to all compounds represented by formula $AB_{2-x}C_xD_{3-x}E_xO_{10}$ ($0 \leq x \leq 2$), specifically $HCa_{1.5}La_{0.5}Nb_{2.5}Ti_{0.5}O_{10}$ or $LaNbTi_2O_{10}$, in addition to $CsLa_2NbTi_2O_{10}$.

As to the other metal compounds having photocatalytic properties, the easily available products thereof can be used.

In the invention, at least one metal compound selected from the group consisting of $TiO_2$, $RTiO_3$, $AB_{2-x}C_xD_{3-x}E_xO_{10}$, $SnO_2$, $ZrO_2$, ZnO, ZnS, CdS, PbS, SiC, $WO_3$, CdSe, MoSe, $MoSe_2$, $Bi_2O_3$ and $Fe_2O_3$, or a combination of at least two compounds selected from the foregoing group is used as dispersing grains or a thin film. In the former case, the metal compound is contained as a grain dispersion in the image recording layer comprising an oxidizable material and a reducible material. In the latter case, on the other hand, the combination is provided on a support as a thin film in contact with the image recording layer.

When the photocatalytic metal compound is provided as a thin film on a support separately from the image recording layer comprising an oxidizable material and a reducible material, but so as to be in contact with this image recording layer, the deposit produced from the reducible material is carried on the adjacent thin film of the photocatalytic metal compound to convert the thin film surface into hydrophilic property. In this case, therefore, it can be said that the image recording layer is a composite layer constituted of the layer of a medium containing an oxidizable material and a reducible material and the thin film of photocatalytic metal compound. Such being the case, the thin films of photocatalytic metal compounds are also illustrated in this section concerning image recording layers.

The thin film of photocatalytic metal compound(s) or the layer containing a dispersion of metal compound grains can be provided on a substrate (support) using any of known methods, e.g., (1) a method of coating a fine grain dispersion of the foregoing oxide(s), (2) a method of burning after coating to reduce the binder content or to remove the binder, (3) a method of forming a film by depositing the metal compound(s) at the molecular (atomic) level using vacuum deposition, sputtering or ion plating technique, (4) a method of coating an organic compound, e.g., a metal alcoholate, hydrolyzing it and further oxidizing the hydrolysis product by burning to form a metallic thin film of an appropriate thickness, or (5) a method of spraying an aqueous solution of hydrochloride or nitrate containing the foregoing metal(s) under heating.

The method (1) is explained below taking the case of coating a fine-grain layer of barium titanate. For instance, the method (1) includes a method of forming a surface layer by coating a dispersion of mixed grains of barium titanate and silica and a method of coating a mixture of barium titanate and organopolysiloxane or monomer(s) thereof. Also, the oxide(s) dispersed in a polymer binder capable of coexisting with the oxide (s) can be coated for obtaining an oxide layer. As a binder for fine-grain oxides, polymers having dispersibility for the fine grains of barium titanate can be widely used. Suitable examples of a binder polymer include hydrophobic binders, such as polyalkylenes including polyethylene, polybutadiene, polyacrylic acid esters, polymethacrylic acid esters, polyvinyl acetate, polyvinyl formate, polyethylene terephthalate, polyethylene naphthalate, polyvinyl alcohol, partially saponified polyvinyl alcohols and polystyrene. These polymers may be used as a mixture of two or more thereof.

In addition to barium titanate, this method can be applied to magnesium titanate, calcium titanate, strontium titanate, or an intermolecular compound or mixture of two or more thereof.

Fine grains of $CsLa_2NbTi_2O_{10}$ also can be provided as a thin film by use of the coating method (1). Specifically, fine grains of $CsLa_2NbTi_2O_{10}$ are produced by placing $Cs_2CO_3$, $La_2O_3$, $NbO_5$ and $TiO_2$ in their respective stoichiometrical amounts in a mortar, grinding them to a fine powder, burning the fine powder in a platinum crucible at 130° C. for 5 hours, placing the burned matter in a mortar after cooling, and then grinding it to fine grains having a size of no greater than several microns. These fine grains of $CsLa_2NbTi_2O_{10}$ are dispersed into a binder in analogy with those of barium titanate, and then formed into a thin film by a coating. This process can be applied to not only fine grains of $CsLa_2NbTi_2O_{10}$ but also fine grains of the foregoing compounds represented by $AB_{2-x}C_xD_{3-x}E_xO_{10}$ ($0 \leq x \leq 2$), such as $HCa_{1.5}La_{0.5}Nb_{2.5}Ti_{0.5}O_{10}$ and $HLa_2NbTi_2O_{10}$.

The coating of other photocatalytic metal oxide grains can also be provided according to the aforementioned processes.

The foregoing burning method (2) is a method of forming a thin film having a photocatalytic metal compound concentration heightened by burning the grain-dispersed layer provided using the coating method (1) to remove the organic binder therefrom. The burning temperature can be generally selected from the range of 200 to 600° C., though the appropriate one depends on the species of metal compound grains and that of organic binder.

For forming a photocatalytic metal oxide layer by the use of the foregoing method (3), it is desirable to adopt the sputtering method or vacuum thin film formation method. In the sputtering method, a simple substance or binary oxide target is prepared in advance. For instance, RF sputtering is carried out using a barium titanate target in the atmosphere of an argon-oxygen mixture while keeping the temperature of a support for the evapor-deposited film at 450° C. or higher. The crystallinity control may be carried out by post annealing at 300–900° C., if desired. Besides the $RTiO_3$ (wherein R is an alkaline earth metal atom) as mentioned above, the concept of this method can be introduced into the thin film formation of the other photocatalytic metal oxides as recited above, provided that the substrate temperature is adjusted to a most suitable temperature for crystallinity control.

In the case of forming a thin film of tin oxide, the RF sputtering under the substrate temperature of 120° C. in the atmosphere of an argon-oxygen mixture can provide a tin oxide thin film according to the present object at the RF power of 200 W.

The foregoing method (4) using a metal alcoholate is a method of forming the desired thin film without using a binder. In accordance with this method, the desired thin film of barium titanate can be formed by coating an alcohol solution of barium ethoxide-titanium butoxide mixture on a silicon substrate having $SiO_2$ on the surface, hydrolyzing the coating surface, and then heating the hydrolyzed products at a temperature of at least 200° C. Besides being applied to the thin film formation of other compounds represented by $RTiO_3$ (wherein R is an alkaline earth metal atom), this method can be applied to the thin film formation of photocatalytic metal compounds of other types, such as $AB_{2-x}C_xD_{3-x}E_xO_{10}$ (wherein A, B, C, D and E have the same meanings as defined above, respectively), $SnO_2$, $Bi_2O_3$ and $Fe_2O_3$.

The foregoing method (5) of forming a metal oxide thin film capable of performing a photocatalytic function can also be applied to the thin film formation of binder-free systems. For instance, the thin film of $SnO_2$ can be formed by spraying an aqueous hydrochloric acid solution of $SnCl_4$ on the quarts or crystalline glass surface heated up to at least 200° C. In addition to the thin film formation of $SiO_2$, this method can also be applied to the thin film formation of the other photocatalytic metal compounds, including $RTiO_3$ (wherein R is an alkaline earth metal atom) and $AB_{2-x}C_xD_{3-x}E_xO_{10}$ (wherein A, B, C, D and E have the same meanings as defined above, respectively).

When those metal compound grains are provided as a layer of dispersed grains on a support, the optimal grain sizes thereof, though depend on the refractive indices and the extinction coefficients of the substances constituting the grains, are generally from 0.01 to 10 µm, preferably from 0.02 to 5 µm. The inefficient light absorption is caused by light scattering when the grain sizes are too small, while it is cased by lowering of dispersibility and reflection at the interface between grains when the grain sizes are too large.

In the hydrophilic layer of metal compound grains having photocatalytic properties, the suitable proportion of the volume occupied by the metal compound grains is from 10 to 95% by volume, preferably from 20 to 90% by volume.

The suitable thickness of the metal oxide thin film is from 1 to 100,000 angstrom, preferably from 10 to 10,000 angstrom, in any of the foregoing cases. Further, it is advantageous to adjust the thickness to at most 3,000 angstrom in order to prevent the distortion by light interference. In order to fully achieve the photoactivation effect, on the other hand, it is favorable to adjust the thickness to at least 50 angstrom.

In cases of using binders for thin film formation of the foregoing photocatalytic metal oxides, the suitable proportion of the volume occupied by the metal oxide in each thin film is from 50 to 100%, preferably at least 90%. In particular, it is advantageous that the volume proportion is substantially 100%, namely the metal oxide forms a continuous layer.

(Reducible Materials)

A wide variety of materials can be used as reducible materials (i.e., material which are reduced) as far as they can react with oxidizable materials (i.e., materials which are oxidized) in the presence of photocatalytic materials to deposit reduction products on the surface of the photocatalytic materials, thereby converting the polarity of the image recording layer. The materials preferred as the reducible materials are materials capable of providing deposits to roughen the deposits-carrying surface of the photocatalytic material. This is because the surface can acquire hydrophilic properties by its shape of being rough regardless of the hydrophilic or hydrophobic degree of the material in itself.

As suitable examples of a material of such a kind, namely a material which can deposit by being reduced itself to change the shape of the deposits-carrying surface, thereby causing a polarity change to render the surface hydrophilic, mention may be made of inorganic oxidizing agents, such as metal salts and oxyacid salts of heavy metals.

As appropriate metal salts, any salts can be used as far as they can deposit as metal fine pieces on the grain surface of a photocatalytic metal compound by undergoing photoreductive action upon active ray irradiation to the photocatalytic metal compound grains. In particular, the salts of metals situated behind hydrogen in the order of ionization tendency, namely Cu, Ag, Pt, Au, Pd, In and Rh, are used to advantage. As suitable examples of an oxyacid salt of a heavy metal, on the other hand, mention may be made of dichromates and permanganates. With respect to the form of these salts, the alkali metal salts are preferable.

The water-soluble metal salts used for forming metal fine pieces include nitrates, sulfates, halogenates, halogenides, complex salts of halogenic acids, complex salts of ammonia (ammoniacal aqueous solutions of these salts) and sulfites of the metals recited above as advantageously usable ones.

In addition, the metal complex salts of ammonia, carboxylic acids and organic sulfur compounds may be used for the foregoing purpose. Examples of such metal complex salts include silver ammine complex nitrate, silver acetate, silver lactate, silver benzoate, 2-mercaptobenzimidazole silver, 5-methyl-1,3,4-thiadiazol-2-thiol silver and 1-phenyl-1H-tetrazole silver.

For making a printing plate from the present printing plate precursor, various methods can be employed, which include, e.g., (i) a method of immersing the present photosensitive printing plate precursor containing photocatalytic metal compound grains in a water solution of metal salt as recited above and giving the plate precursor immersed in the water solution imagewise irradiation with active rays, (ii) a method of impregnating the present photosensitive plate precursor containing photocatalytic metal compound grains with a water solution of metal salt as recited above and giving the resultant plate precursor imagewise irradiation with active rays and (iii) a method of incorporating a metal salt as recited above together with photocatalytic metal compound grains into the photosensitive layer of a plate precursor and giving the resultant plate precursor imagewise irradiation with active rays. In a case of using the metal salt as a water solution, the metal salt concentration in the water solution is from 0.0001 to 10 mole/l, preferably from 0.001 to 5 mole/l, particularly preferably from 0.01 to 3 mole/l. The water solution having its concentration in such a range is also used in a case where the photosensitive printing plate precursor is impregnated with a metal salt prior to imagewise irradiation. In the case of adding a metal salt as a constituent element to the photosensitive layer, the metal salt content on a dry basis in the coated layer is from 0.0001 to 10 mole/l, preferably from 0.001 to 5 mole/l, particularly preferably from 0.01 to 3 mole/l.

The coverage of metal fine pieces deposited by the A photocatalytic metal compound undergoing imagewise irradiation with active rays in the presence of the metal salt having the foregoing concentration is a coverage enough to enable the polarity conversion of the plate precursor surface and thereby to show hydrophilic properties. In general the coverage enabling the polarity conversion at the practical level is at least 2%, and the whole surface may be covered with metal fine peices. However, the coverage suitable for keeping the surface highly hydrophilic is 90% or less, preferably from 20 to 80%. The concentration of the metal salt present together with a photocatalytic metal compound, the illumination of active ray irradiation and the irradiation time are chosen so that the coverage as mentioned above is realized.

(Oxidizable Materials)

A wide variety of oxidizable materials (i.e., materials which are oxidized) can be used as far as they can undergo reaction in the presence of photocatalytic materials to promote the deposition of reduced products on the surface of the photocatalytic materials, thereby changing the polarity of the image recording layer. In such a reaction, it is thought that the oxidizable materials are oxidized to decompose themselves and thereby reduced in quantity or lost. Suitable examples of such an oxidizable material include high molecular weight compounds and low molecular weight compounds (including oligomers) having hydroxyl groups, carboxyl groups, amino groups, amido groups, sulfonamido groups, formyl groups, carbonyl groups, ester linkages, ether linkages, urethane linkages or urea linkages. Of these compounds, the high molecular weight compounds can be used in the practical mode allowing them to serve also as a medium of the image recording layer, so that they are illustrated in the next section entitled "Medium of Image Recording Layer". On the other hand, the low molecular weight compounds are illustrated below.

Examples of an oxidizable low molecular weight compound which can be used for the purposes of the invention include saccharides and carbohydrates, such as malt sugar, milk sugar, dextran, dextrin and soluble starch (although these compounds include high molecular weight compounds, the compounds converted so as to have low molecular weight by hydrolysis are also included therein, so that they are illustrated in this paragraph for convenience's sake); aldehydes, such as formaldehyde, acetoaldehyde, glyoxal, succinic dialdehyde, butyl aldehyde, 3-hydroxy-2-methylpentanal, 3-formyl-2-hydroxypropionic acid, terephthalaldehyde and p-hydroxybenzaldehyde; hydroxyl group-containing compounds including alcohols and phenols, such as sorbitol, cylcohexanol, n-decyl alcohol, glycerin, erythritol, benzyl alcohol, 4-methoxyphenol and hydroquinone; carboxyl group-containing compounds, such as lauric acid, β-chloropropionic acid, benzoic acid, salicylic acid, adipic acid, succinic acid, glycine and phthalic acid; ethers, such as ethylene glycol dimethyl ether; amides, such as acetylurea, ethyleneurea, m-nitrobenzamide, salicylanilide, terephthalic acid amide, p-toluenesulfonamide and N-methylpyrrolidone; esters, such as diphenyl carboxylate, ethyl p-hydroxybenzoate, ethyl p-hydroxybenzoate, n-butyl carbamate and ethylene glycol monoethyl ether monoacetate; amines, such as laurylamine, p-chloroaniline, p-hydroxyphenylamine, diphenylamine and p-aminosalicylic acid; and ketones, such as acetylacetone, acetophenone, benzophenone and dibenzoylmethane.

When these compounds are used, the addition amount thereof, though depends on their species, is from 0.1 to 50 weight %, preferably from 0.5 to 30 weight %, of the solids weight of the hydrophobic layer.

In the present invention, as mentioned above, the deposition of metal fine pieces upon imagewise irradiation with active rays is promoted by oxidizable materials. The oxidizable materials used herein may be the low molecular weight or oligomer compounds alone, or oxidizable hydrophilic or organic high molecular weight compounds illustrated below, or mixtures of these compounds.

(Medium of Image Recording Layer)

As the structure of the present image recording layer, it is simplest and essential that the layer of photocatalytic metal compound grains dispersed in a medium constitutes the image recording layer, or the image recording layer is constituted of a thin film of photocatalytic metal compound and a medium layer provided in contact with this thin film. In the present plate-making process the irradiated area of the plate precursor is converted into a hydrophilic area to form an imagewise distribution of hydrophilic areas and hydrophobic areas, so that it is advantageous for the medium to be hydrophobic in itself from the viewpoint of enhancing the distinguishability. In many cases, however, it is desirable that the step of depositing metal fine pieces by photoreduction be carried out in an aqueous medium, and the medium is required to be hydrophilic to some extent for the purpose of securing the dispersibility of photocatalytic metal compound grains. Moreover, the hydrophilic extent of the exposed area is very high in the invention. Therefore, the distinguishability can be ensured even when the medium used is hydrophilic to some extent so long as the non-irradiated area is relatively hydrophilic. Such being the case, the following media which are hydrophilic to some extent can be used in the invention so far as they can ensure a hydrophilicity-hydrophobicity difference enough to produce an effect of distinguishing ink receptivity from ink repellency between the unexposed areas and the exposed areas. Suitable examples of a medium usable in the invention include hydrophilic high molecular media and hydrophilic sol-gel conversion media. Of these media, the hydrophilic high molecular compounds subject to oxidative decomposition, such as polyvinyl alcohol, carboxyl-modified polyvinyl alcohol and polyvinyl pyrrolidone, and the hydrophilic sol-gel conversion media capable of forming gel structure of polysiloxanes are preferred. In particular, the former ones are employed to advantage. Further, the high molecular media as described above and the hydrophilic high molecular or sol-gel conversion media described above can be used as a proper mixture to adjust the hydrophilicity-hydrophobicity difference to a desirable level. Now, the hydrophilic media usable in the present image recording layer are described in detail.

<Hydrophilic High Molecular Compounds>

Besides the synthetic high molecular compounds described above, the organic high molecular compounds having hydroxyl groups can he used in the image recording layer of the present lithographic printing plate precursor with the intention of securing an appropriate strength for the image recording layer and imparting hydrophilic properties to the image-drawn area surface. Examples of high molecular compounds usable in the image recording layer include water-soluble resins, such as polyvinyl alcohol (PVA), modified polyvinyl alcohols including carboxyl-modified PVA, polyacrylic acid, polyethyleneimine, starch and derivatives thereof, cellulose derivatives including carboxymethyl cellulose and hydroxyethyl cellulose, casein, gelatin, polyvinyl pyrrolidone, vinyl acetate-crotonic acid copolymer and styrene-maleic acid copolymers.

Examples of a waterproof imparting agent which can cross-link and harden the hydroxyl group-containing organic high molecular compound as described above include aldehydes, such as glyoxal, melamine-formaldehyde resin, ureaformaldehyde resin; methylol compounds, such as N-methylolurea, N-methylolmelamine and methylolated polyamide resin; active vinyl compounds, such as divinylsulfone and bis(β-hydroxyethylsulfonic acid); epoxy compounds, such as epichlorohydrin, polyethylene glycol diglycidyl ether, polyamide-polyamine-epichlorohydrin adduct and polyamide-epichlorohydrin resin; ester compounds, such as monochloroacetic acid esters and thioglycolic acid esters; polycarboxylic acids, such as polyacrylic acid and methylvinyl ether-maleic acid copolymer; inorganic cross-linking agents, such as boric acid, titanyl sulfate, Cu salts, Al salts, Sn salts, V salts and Cr salts; and modified polyamide-polyamide resins. In addition, cross-linking catalysts such as ammonium chloride, silane coupling agents and titanate coupling agent can be used together with the waterproof imparting agents as described above.

In the invention, gelatin may be used as the hydrophilic high molecular compound as mentioned above. Gelatin is one of derived proteins, and any of gelatins is usable in the invention as far as it is produced from collagen and called gelatin. However, the gelatins having light-colored, transparent, tasteless and odorless appearances are preferred. Further, the gelatins for photographic emulsions are used to advantage because the extents of their physical properties, including viscosity and jelly strength, are fixed.

When gelatins are used in the present image recording layer, gelatin hardening compounds are used together to harden the recording layer, thereby rendering the layer highly waterproof.

As the gelatin hardening compounds, hitherto known compounds can be employed. For instance, such compounds are described in T. H. James, *The Theory of The Photographic Process*, chapter 2, section III, Macmillan Publishing Co., Inc. (1977), and *Research Disclosure*, No. 17643, p. 26 (December, 1970).

Suitable examples of such a gelatin hardening compound include dialdehydes, such as succinaldehyde, glutaraldehyde and adipoaldehyde; diketones, such as 2,3-butanedione, 2,5-hexanedione, 3-hexene-2,5-dione and 1,2-cyclopentanedione; and active olefin compounds having at least two double bonds to which electron-attractive groups are adjacently linked.

The suitable amount of gelatin hardening compound used is from 0.5 to 20 parts by weight, preferably from 0.8 to 10 parts by weight, per 100 parts by weight of gelatin.

The gelatin hardening compounds used in the foregoing range can ensure film strength and water resistance for the resultant image recording layer, and besides, they put no impediment to hydrophilic properties of the image recording layer.

The suitable proportion of the foregoing media to photocatalytic grains in the image recording layer, whether they are used alone or as a mixture, is from 5 to 80%, preferably from 10 to 60%

<Sol-Gel Conversion Medium Layer>

Especially suitable binder for the present image recording layer is the sol-gel conversion binder as mentioned below. The system capable of undergoing the sol-gel conversion is made up of dendritic macromolecules that form a network structure by bonding groups attached to their polyvalent elements being linked via oxygen atoms and also have unbonded hydroxyl and alkoxy groups on their polyvalent elements. This system is in a sol state and has hydrophilic properties when it has large quantities of unbonded alkoxy and hydroxyl groups. As the ether linkage proceeds, the lattice-like resinoid structure formed becomes firm. In addition to the property of changing the hydrophilicity of the resin structure, this system has such a function as to change the hydrophilicity of solid fine grains by modifying the grain surface through the binding of part of the hydroxyl groups contained therein to the fine grains. The polyvalent bonding elements contained in the compounds having hydroxyl and alkoxy groups capable of undergoing sol-gel conversion include aluminum, silicon, titanium and zirconium. Although these elements are all usable in the invention, the most favorably used system utilizing siloxane bonds for sol-gel conversion is illustrated below. Additionally, the sol-gel conversion utilizing aluminum, titanium or zirconium can be performed by substituting each of these elements for silicon in the following illustration.

Namely, the sol-gel convertible system containing a silane compound having at least one silanol group is used to particular advantage.

The systems utilizing sol-gel conversion are illustrated below in more detail.

The suitable inorganic hydrophilic matrices formed by sol-gel conversion are resins having siloxane bonds and silanol groups. The image recording layer of a lithographic printing plate precursor according to the invention is prepared from a sol system containing a silane compound having at least one silanol group. And this sol system sets to gel by forming a structure made up of siloxane-basic structure through the progress of hydrolysis condensation of silanol groups during the lapse of time after coating, thereby completing the layer formation. To the matrix of such a gel structure, it is desirable to add ingredients, such as the organic polymers as described below, for the purpose of improving physical properties and coatability, thereby forming the recording layer in which the desired compounds are incorporated.

The siloxane resin forming a gel structure is represented by the following formula (I), and the silane compound having at least one silanol group is represented by the following formula (II). Additionally, the material system that is contained in an image recording layer and can change from hydrophilic property to hydrophobic property is not necessarily made up of a silane compound of formula (II) alone, but in general it may be composed of oligomers produced by partial hydrolysis polymerization of a silane compound represented by formula (II) or a mixture of such a silane compound and oligomers thereof.

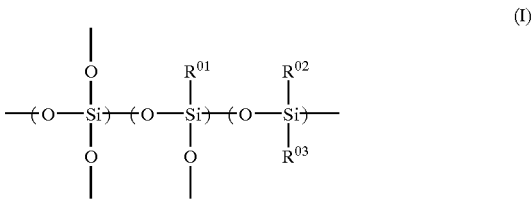

The siloxane resin represented by formula (I) is formed by the sol-gel conversion of a dispersion containing at least one silane compound represented by formula (II). At least one of $R^{01}$ to $R^{03}$ groups in formula (I) represents a hydroxyl group, and others each represents an organic residue selected from those represented by $R^0$ or Y in formula (II).

In formula (II), $R^0$ represents a hydroxyl group, a hydrocarbon group or a heterocyclic group, Y represents a hydrogen atom, a halogoen atom, —$OR^1$, —$OCOR^2$ or —$N(R^3)(R^4)$ (wherein $R^1$ and $R^2$ are each a hydrocarbon group, and $R^3$ and $R^4$, which may be the same or different, are each a hydrogen atom or a hydrocarbon atom), and n is 0, 1, 2 or 3.

Examples of a hydrocarbon or heterocyclic group represented by $R^0$ in formula (II) include a substituted or unsubstituted straight-chain or branched alkyl group containing 1 to 12 carbon atoms [e.g., methyl, ethyl, propyl, butyl, pentyl, hexyl, heptyl, octyl, nonyl, decyl, dodecyl; which may be substituted with at least one substituent, e.g., a halogen atom (such as chlorine, fluorine or bromine), a hydroxyl group, a thiol group, a carboxyl group, a sulfo group, a cyano group, an epoxy group, an —OR' group (wherein R' is a methyl, ethyl, propyl, butyl, heptyl, hexyl, octyl, decyl, propenyl, butenyl, hexenyl, octenyl, 2-hydoxyethyl, 3-chloropropyl, 2-cyanoethyl, N,N-dimethylaminoethyl, 2-bromoethyl, 2-(2-methoxyethyl)oxyethyl, 2-methoxycarbonyl-ethyl, 3-carboxypropyl or benzyl group), an —OCOR" group (wherein R" has the same meaning as R'), a —COOR" group, a —COR" group, an —N(R''') (R''') group (wherein each R''' is a hydrogen atom or the same group as R', and two R''' may be the same or different), a —NHCONHOR" group, a —NHCOOR" group, an —Si(R")₃ group, a —CONHR''' group or an —NHCOR" group], a substituted or unsubstituted straight-chain or branched alkenyl group containing 2 to 12 carbon atoms (e.g., vinyl, propenyl, butenyl, pentenyl, hexenyl, octdenyl, decenyl, dodecenyl; which each may be substituted with the same substituent for the alkyl group described above), a substituted or unsubstituted aralkyl group containing 7 to 14 carbon atoms (e.g., benzyl, phenetyl, 3-phenylpropyl, naphthylmethyl, 2-naphthylethyl; which each may be substituted with at least one substituent which is the same substituent for the alkyl group described above), a substituted or unsubstituted alicyclic group containing 5 to 10 carbon atoms (e.g., cyclopentyl, cyclohexyl, 2-cyclohexylethyl, 2-cyclopentylethyl, norbornyl, adamantyl; which each may be substituted with at least one substituent which is the same substituent for the alkyl group described above), a substituted or unsubstituted aryl group containing 6 to 12 carbon atoms (e.g., phenyl, naphthyl; which each may be substituted with at least one substituent which is the same substituent for the alkyl group described above), and a heterocyclic group containing at least one hetero atom selected from nitrogen, oxygen and sulfur atoms, which may be a condensed-ring group (e.g., a monovalent group derived from a pyran ring, a furan ring, a thiophene ring, a morpholine ring, a pyrrole ring, a thiazole ring, an oxazole ring, a pyridine ring, a piperidine ring, a pyrrolidone ring, a benzothiazole ring, a benzoxazole ring, a quinoline ring or a tetrahydrofuran ring; which may have at least one substituent which is the same substituent for the alkyl group described above).

The $-OR^1$, $-OCOR^2$ and $-N(R^3)(R^4)$ groups which the substituent Y in formula (II) can represent are illustrated below.

$R^1$ in the $-OR^1$ group represents a substituted or unsubstituted aliphatic group containing 1 to 10 carbon atoms (e.g., methyl, ethyl, propyl, butyl, heptyl, hexyl, pentyl, octyl, nonyl, decyl, propenyl, butenyl, heptenyl, hexenyl, octenyl, decenyl, 2-hydroxyethyl, 2-hydroxypropyl, 2-methoxyethyl, 2-(methoxyethyloxo)ethyl, 2-(N,N-diethylamino)ethyl, 2-methoxypropyl, 2-cyanoethyl, 3-methyloxapropyl, 2-chloroethyl, cyclohexyl, cyclopentyl, cyclooctyl, chlorocyclohexyl, methoxycyclohexyl, benzyl, phenetyl, dimethoxybenzyl, methylbenzyl, bromobenzyl).

$R^2$ in the $-OCOR^2$ group represents an aliphatic group having the same meaning as $R^1$, or a substituted or unsubstituted aromatic group containing 6 to 12 carbon atoms (including the same aryl groups as described in the description of $R^0$).

$R^3$ and $R^4$ in the $-N(R^3)(R^4)$ group, which may be the same or different, each represents a hydrogen atom, or a substituted or unsubstituted aliphatic group containing 1 to 10 carbon atoms (including the same groups as represented by $R^1$ in the foregoing $-OR^1$ group).

As to these groups, it is desirable that the total number of carbon atoms contained in the combination of $R^3$ and $R^4$ be 16 or less.

Examples of a silane compound represented by formula (II) are illustrated below, but these examples should not be construed as limiting the scope of the invention in any way.

Specifically, such silane compounds include tetrachlorosilane, tetrabromosilane, tetramethoxysilane, tetraethoxysilane, tetraisopropoxysilane, tetra(n-propyl) silane, tetra(t-butoxy)silane, tetra(n-butoxy)silane, methyltrichlorosilane, methyltribromosilane, methyltrimethoxysilane, methyltriethoxysilane, methyltriisopropoxysilane, methyltri(t-butoxy)silane, ethyltrichlorosilane, ethyltribromosilane, ethyltrimethyoxysilane, ethyltriethoxysilane, ethyltriisopropoxysilane, ethyltri(t-butoxy)ssilane, n-propyltrichlorosilane, n-propyl-tribromosilane, n-propyltrimethoxysilane, n-propyl-triethoxysilane, n-propyltriisopropoxysilane, n-propyl-tri(t-butoxy)silane, n-hexyltrichlorosilane, n-hexyl-tribromosilane, n-hexyltrimethoxysilane, n-hexyltriethoxy-silane, n-hexyltriisopropoxysilane, n-hexyltri(t-butoxy)-silane, n-decyltrichlorosilane, n-decyltribromosilane, n-decyltrimethoxysilane, n-decyltriethoxysilane, n-decyltriisopropoxysilane, n-decyltri(t-butoxy)silane, n-octadecyltrichlorosilane, n-octadecyltribromosilane, n-octadecyltrimethoxysilane, n-octadecyltriethoxysilane, n-octadecyltriisopropoxysilane, n-octadecyltri(t-butoxy)-silane, phenyltrichlorosilane, phenyltribromosilane, phenyltri-methoxysilane, phenyltriethoxysilane, phenyltriisopropoxy-silane, phenyltri(t-butoxy)silane, dimethoxydiethoxysilane, diemthyldichlorosilane, dirmethyldibromosilane, dimethyl-dimethoxysilane, dirmethyldiethoxysilane, diphenyldichloro-silane, diphenyldibromosilane, diphenyldimethoxysilane, diphenyldiethoxysilane, phenylmethyldichlorosilane, phenylmethyldibromosilane, phenylmethyldimethoxysilane, phenylmethyldiethoxysilane, triethoxyhydrosilane, tribromohydrosilane, trimethoxyhydrosilane, triisopropoxyhydrosilane, tri(t-butoxy)hydrosilane, vinyltrichlorosilane, vinyltribromosilane, vinyltrimethoxysilane, vinyltriethoxysilane, vinyltriisopropoxysilane, vinyltri(t-butoxy)silane, trifluoropropyltrichlorosilane, trifluoropropyltrichlorosilane, trifluoropropyltribromosilane, trifluoropropyltrimethoxysilane, trifluoropropyltriethoxysilane, trifluoropropyltriisopropoxysilane, trifluoropropyltri(t-butoxy)silane, γ-glycidoxypropylmethyldimethoxysilane, γ-glycidoxypropylmethyldiethoxysilane, γ-glycidoxypropyltrimethoxysilane, γ-glycidoxypropyltriethoxysilane, γ-glycidoxypropyltriisopropoxysilane, γ-glycidoxypropyltri(t-butoxy)silane, γ-methacryloxypropylmethyldimethoxysilane, γ-methacryloxypropylmethyldiethoxysilane, γ-methacryloxypropyltrimethoxysilane, γ-methacryloxypropyltriisopropoxysilane, γ-methacryloxypropyltri(t-butoxy)silane, γ-aminopropylmethyldimethoxysilane, γ-aminopropylmethyldiethoxysilane, γ-aminopropyltrimethoxysilane, γ-aminopropyltriethoxysilane, γ-aminopropyltriisopropoxysilane, γ-aminopropyltri(t-butoxy)silane, γ-mercaptopropylmetyldimethoxysilane, γ-mercaptopropylmethyldiethoxysilane, γ-mercaptopropyltrirmethoxysilane, γ-mercaptopropyltriethoxysilane, γ-mercaptopropyltriisopropoxysilane, γ-mercaptopropyltri(t-butoxy)silane, β-(3,4-epoxycyclohexyl)-ethoxytrirmethoxysilane, and β-(3,4-epoxycyclohexyl) ethoxy-triethoxysilane.

In combination with the silane compounds represented by formula (II), which are used for forming the present image recording layer, the metal compounds capable of bonding to resins at the time of sol-gel conversion to be formed into film, such as Ti, Zn, Sn, Zr and Al compounds, can be used.

Examples of such metal compounds include Ti(OR")$_4$ (wherein R" is a methyl, ethyl, propyl, butyl, pentyl or hexyl group), TiCl$_4$, Zn(OR")$_2$, Zn(CH$_3$COCHCOCH$_3$)$_2$, Sn(OR")$_4$, Sn(CH$_3$COCHCOCH$_3$)$_4$, Sn(OCOR")$_4$, SnCl$_4$, Zr(OR")$_4$, Zr(CH$_3$COCHCOCH$_3$)$_4$, Al(OR")$_3$ and Al(CH$_3$COCHCOCH$_3$)$_4$.

For promoting the hydrolysis and polycondensation reactions of the silane compounds represented by formula (II) and, if used in combination therewith, the foregoing metal compounds also, it is desirable to carry out those reactions in the presence of an acidic or basic catalyst.

With respect to such a catalyst, the acidic or basic compounds may be used as they are, or in a condition that they are dissolved in a solvent, such as water or alcohol (hereinafter referred to as "acidic catalyst" or "basic catalyst", respectively). The catalyst concentration has no particular limitation, but when it is high both hydrolysis and polycondensation speeds have a tendency to be increased. However, some basic catalysts produce precipitates in sol solutions when they have high concentrations. Therefore, it is desirable that the basic catalyst concentration be adjusted to 1 N or less (on a water solution basis).

The acidic and basic catalysts are not particularly restricted as to their kinds. In the case of requiring the use of a catalyst in a high concentration, however, it is advantageous to use a catalyst of the kind which is constituted of elements leaving almost no crystalline residue after sintering. Suitable examples of an acidic catalyst include hydrogen halides such as hydrochloric acid, nitric acid, sulfuric acid, sulfurous acid, hydrogen sulfide, perchloric acid, hydrogen peroxide, carbonic acid, carboxylic acids such as formic acid and acetic acid, substituted carboxylic acids represented by RCOOH (wherein R is substituted with other elements or substituents), and sulfonic acids such as benzenesulfonic acid; while those of a basic catalyst include ammoniacal bases such as aqueous ammonia, and amines such as ethylamine and aniline.

As mentioned above, the image recording layer formed by the sol-gel method is especially suitable for the present lithographic printing plate precursor. Further details of the sol-gel method are described in literatures, e.g., Sumio Sakibana, "Science of Sol-Gel Methods", Agune Shofusha (1988), and Seki Hirashima, "Techniques for Preparing Functional Thin Films by The Newest Sol-Gel Methods", Sogo Gijutsu Center (1992).

<Organic High Molecular Compounds>

The organic high molecular compounds having hydrophobic properties can be used for the purpose of making the surface polarity of the image layer more hydrophobic to heighten the capability to distinguish from the exposed area.

Examples of an organic high molecular compound usable for the foregoing purpose include polyvinyl chloride, polyvinyl acetate, polyvinyl phenol, polyvinyl halogenated phenol, polyvinyl formal, polyvinyl acetal, polyvinyl butyral, polyamide, polyurethane, polyurea, polyimide, polycarbonate, epoxy resin, phenolic resin, novolack resins, condensation resins of resol phenols and aldehydes or ketones, polyvinylidene chloride, polystyrene, silicone resin, acrylic copolymers having alkali-soluble groups, such as active methylene, phenolic hydroxyl groups, sulfonamide groups or carboxyl groups, and resins obtained by copolymerization or at least terpolymerization of monomers constituting the above-described resins.

Of these resins, phenol novolak and resol resins are preferred, with examples including the resins prepared by condensing phenolic compounds, such as phenol, cresol (e. g., m-cresol, p-cresol, m/p mixed cresol), phenol/cresol mixture (e.g., phenol/m-cresol, phenol/p-cresol, phenol/m-cresol/p-cresol), phenol-modified xylene, tert-butylphenol, octylphenol, resorcinol, pyrogallol, catechol, chlorophenol (e.g., m-chlorophenol, p-chlorophenol), bromophenol (e.g., m-bromophenol, p-bromophenol), salicylic acid and phloroglucinol, and formaldehyde or acetone.

As other examples of a high molecular compound suitable for the foregoing purpose, mention may be made of copolymers having constitutional repeating units derived from at least two kinds of monomers selected from the following families [A] to [L]. The molecular weight of such copolymers each is generally in the range of $1 \times 10^4$ to $2.0 \times 10^5$.

[A] Aromamtic hydroxyl group-containing acrylamides and methacrylamides, aromatic hydroxyl group-containing acrylic acid esters and methacrylic acid esters, and hydroxystyrenes, with examples including N-(4-hydroxyphenyl)acrylamide, N-(4-hydroxyphenyl)methacryl-amide, o-, m- and p-hydroxystyrenesi o-, m- and p-hydroxyphenylacrylates, and o-, m- and p-hydroxyphenyl-methacrylates.

[B] Aliphatic hydroxyl group-containing acrylic and methacrylic acid esters, such as 2-hydroxyethylacrylate and 2-hydroxyethylmethacrylate.

[C] Unsubstituted and substituted acrylic acid esters, such as methyl acrylate, ethyl acrylate, propyl acrylate, butyl acrylate, amyl acrylate, hexyl acrylate, cyclohexyl acrylate, octyl acrylate, phenyl acrylate, benzyl acrylate, 2-chloroethyl acrylate, 4-hydroxybutyl acrylate, glycidyl acrylate and N-dimethylaminoethyl acrylate.

[D] Unsubstituted and substituted methacrylic acid esters, such asmethyl methacrylate, ethylmethacrylate, propyl methacrylate, butyl methacrylate, amyl methacrylate, hexyl methacrylate, cyclohexyl methacrylate, octyl methacrylate, phenyl methacrylate, benzyl methacrylate, 2-chloroethyl methacrylate, 4-hydroxybutyl methacrylate, glycidyl methacrylate and N-dimethylaminoethyl methacrylate.

[E] Acrylamides and methacrylamides, such as acrylamide, methacrylamide, N-methylolacrylamide, N-methylolmethacryl-amide, N-ethylacrylamide, N-ethyl-methacrylamide, N-hexyl-acrylamide, N-hexylmethacrylamide, N-cyclohexylacrylamide, N-cyclohexylmethacrylamide, N-hydroxyethylacrylamide, N-hydroxyethylmethacrylamide, N-phenylacrylamide, N-phenyl-methacrylamide, N-benzylacrylamide, N-benzylmethacrylamide, N-nitrophenylacrylamide, N-nitrophenylmethacrylamide, N-ethyl-N-phenylacrylamide and N-ethyl-N-phenylmethacrylamide.

[F] Vinyl ethers, such as ethyl vinyl ether, 2-chloroethyl vinyl ether, hydroxyethyl vinyl ether, propyl vinyl ether, butyl vinyl ether, octyl vinyl ether and phenyl vinyl ether.

[G] Vinyl esters, such as vinyl acetate, vinyl chloroacetate, vinyl butyrate and vinyl benzoate.

[H] Styrenes, such as styrene, methylstyrene and chloromethylstyrene.

[I] Vinyl ketones, such as methyl vinyl ketone, ethyl vinyl ketone, propyl vinyl ketone and phenyl vinyl ketone.

[J] Olefins, such as ethylene, propylene, isobutylene, butadiene and isoprene.

[K] N-vinylpyrrolidone, N-vinylcarbazole, 4-vinylpyridine, acrylonitrile and methacrylonitrile.

[L] Unsaturated sulfonamides: with examples including acrylamides, such as N-(o-aminosulfonylphenyl)acrylamide, N-(m-aminosulfonylphenyl)acrylamide, N-(p-aminosulfonylphenyl)acrylamide, N-[1-(3-aminosulfonyl)naphthyl]acrylamide and N-(2-aminosulfonylethyl)acrylamide; methacrylamides, such as N-(o-aminosulonylphenyl)methacrylamide, N-(m-aminosulfonylphenyl)methacrylamide, N-(p-aminosulfonylphenyl)methacrylamide, N-[1-(3-aminosulfonyl)naphthyl]-methacrylamide and N-(2-aminosulfonylethyl)methacrylamide; acrylic acid esters, such as o-aminosulfonylphenyl acrylate, m-aminosulfonylphenyl acrylate, p-aminosulfonylphenyl acrylate and 1-(3-aminosulfonylphenylnaphthyl)acrylate; and methacrylic acid esters, such as o-aminosulfonylphenyl methacrylate, m-aminosulfonylphenyl methacrylate, p-aminosulfonylphenyl methacrylate and 1-(3-aminosulfonylphenylnaphthyl)methacrylate.

It is desirable for the organic high molecular compounds as described above to have a weight average molecular weight of from 500 to 1,000,000 and a number average molecular weight of from 200 to 60,000. When these high molecular compounds are added to an image recording layer, their proportion to the total media in the image recording layer may be from 0 to 100 weight %. In other words, the organic high molecular compounds may be used alone or as mixtures with another medium. In the case of mixed use, it goes without saying that the medium composition and the proportion of the organic high molecular compounds in the total media are chosen so as to impart favorable hydrophobicity or hydrophilicity to the image recording layer and ensure appropriate dispersibility for photocatalytic grains. Specifically, the preferred proportion of organic high molecular compounds mixed is in a wide range of 5 to 80 weight %, particularly 5 to 50 weight %.

It is desirable for the organic high molecular compounds used in the present hydrophilic layer to be made up of aqueous emulsions. The term "aqueous emulsion" means the aqueous suspension of hydrophobic polymer, which is constituted of fine polymer particles dispersed in water and, if needed, a protective agent for stabilizing the dispersed particles.

Examples of an aqueous emulsion usable in the invention include vinyl polymer latices (such as polyacrylate latex, polyvinyl acetate latex and ethylene-vinyl acetate copolymer latex), conjugated diene polymer latices (such as methyl methacrylate-butadiene copolymer latex, styrene-butadiene copolymer latex, acrylonitrile-butadiene copolymer latex and chloroprene latex), and polyurethane resin.

(Other Additives to Image Recording Layer)

In addition to the aforementioned light-heat convertible fine pieces-carrying photocatalytic metal compound grains carrying and hydrophobic media, the image recording layer can contain diverse additives for various purposes of controlling the hydrophilicity of the drawn area, heightening the physical strength of the recording layer, improving the mutual dispersibility of ingredients constituting the recording layer, improving coating properties, enhancing printability and facilitating the plate-making operations. Examples of these additives include the following:

<Solated Grains>

In addition to the aforementioned light-heat convertible material system, organic high molecular compounds for control of hydrophilicity of the drawn area and enhancement of film properties, and hydroxyl group-containing high molecular compounds for heightening the hydrophilicity of the drawn area and improving the film properties, the solated grains (or grains in a Sol state) may be contained as the second-component grains in the image recording layer of the present lithographic printing plate precursor.

The solated grains has no particular restriction, but it is appropriate to use silica sol, alumina sol, magnesium oxide sol, magnesium carbonate sol or calcium alginate sol. These solated grains, though they undergo no light-heat conversion, can promote hydrophilic properties of the drawn area and hydropholic properties of the undrawn area and strengthen the sol-gel film.

In particular, silica sol, alumina sol, calcium alginate sol and a mixture of these sols are used to advantage.

Silica sol has many hydroxyl groups on its grain surface, and the inside of silica grains is constituted of siloxane linkages (—Si—O—Si—). The silica sol is a dispersion of ultrafine silica grains, the diameter of which is from 1 to 100 nm, in water or a polar solvent, and is also called colloidal silica. The detailed description thereof can be found in "Application Technique of High Purity Silica", compiled under supervision of Toshiro Kagami and Ei Hayashi, vol. 3, CMC Corporation (1991).

Alumina sol is alumina hydrate (boehmite) having a colloidal size of 5 to 200 nm dispersed in water by the use of anions as a stabilizer (e.g., halogen ion such as fluorine ion or chlorine ion, carboxylic acid anion such as acetic acid ion).

Those sol grains can be used as hydrophobic sol grains by undergoing surface modification with a hydrophobic functional group such as an alkyl group. These modified grains are effective in controlling the hydrophobicity of the undrawn area.

The suitable average diameter of the foregoing solated grains is from 10 to 50 nm, preferably from 10 to 40 nm. All of these solated grains are easily available as commercial products.

The second-component grains having their diameters in the aforementioned range can ensure sufficient film strength in the image recording layer. When the resultant plate precursor is made into a printing plate by exposure to, e.g., laser beams and undergoes printing operations, the printing plate thus made achieve the effect of improving printing ink adhesion to the undrawn area as well as the effect of imparting excellent hydrophilicity to the drawn area to prevent the drawn area from having ink stain.

The ratio of the metal compound grains used in the invention to the solated grains which may be used in combination therewith is from 100:0 to 30:70 by weight, preferably from 100:0 to 40:60 by weight.

In a case where the solated grains are added to the image recording layer, their total amount added is 2 to 50 weight %, preferably 5 to 40 weight %, of the total content of solid components in the image recording layer.

<Dyes and Pigments>

Further, dyes and pigments can be added to the present image recording layer for coloring the layer to distinguish the plate type.

Suitable examples of dyes include Rhodamine 6G chloride, Rhodamine B chloride, Crystal Violet, Malachite Green oxalate, oxazine-4-perchlorate, quinizarin, 2-(α-naphthyl)-5-phenyl-oxazole and coumarin-4. Examples of other usable dyes include triphenylmethane dyes, diphenylmethane dyes, oxazine dyes, xanthene dyes, iminonaphthoquinone dyes, azomethine dyes and anthraquinone dyes, represented by Oil Yellow #101, Oil Yellow #103, Oil Pink #312, Oil Green BG, Oil Blue BOS, Oil Blue #603, Oil Black BY, Oil Black BS, Oil Black T-505 (all the items described above are products of Orient Kagaku Kogyo K.K.), Victoria Pure Blue, Crystal Violet (CI42555), Methyl Violet (CI42535), Ethyl Violet, Methylene Blue (CI52015), Patent Pure Blue (produced by Sumitomo Mikuni Kagaku Co., Ltd.), Brilliant Blue, Methyl Green, Erythrosine B, Basic Fuchsine, m-cresol purple, Auramine, 4-p-diethylaminophenylimino-naphthoquinone and cyano-p-diethylaminophenylacetanilide, and dyes disclosed in JP-A-62-293247 and J-P-A-9-179290 (the term "JP-A" as used herein means an "unexamined published Japanese Patent application).

When the coloring materials as described above are added to the image recording layer, their proportion to the total solid components in the image recording layer is generally from about 0.02 to about 10 weight %, preferably from about 0.1 to about 5 weight %.

<Surfactants>

To the image forming layer of the present lithographic printing plate precursor, any of the nonionic surfactants as disclosed in JP-A-62-251740 and JP-A-3-208514, the anionic surfactants, the cationic surfactants and fluorine-containing surfactants as disclosed in JP-A-2-195356, and the amphoteric surfactants as disclosed in JP-A-59-121044 and JP-A-4-13149 can be added for the purpose of extending the stability against the printing conditions.

Examples of a nonionic surfactant usable herein include sorbitan tristearate, sorbitan monopalmitate, sorbitan trioleate, stearic monoglyceride and polyoxyethylene nonyl phenyl ether.

Examples of an amphoteric surf actant usable herein include alkyldi(aminoethyl)glycine, alkylpolyaminoethylglycine hydrochloride, 2-alkyl-N-carboxyethyl-N-hydroxyethylimidazolinium betaine and N-tetradecyl-N,N-betaine type of surfactant (e.g., Amorgen K, trade name, a product of Daiichi Kogyo K.K.).

Examples of an anionic surfactant usable herein include sodium dodecylbenzenesulfonate, sodium laurylsulfate, sodium alkylnaphthalenesulfonate, sodium polyoxyethylene alkyl phenol ether sulfate and the condensate of naphthalenesulfonic acid and formaldehyde.

Examples of a cationic surfactant usable herein include laurylamine acetate, lauryltrimethylammonium chloride, distearyldimethylammonium chloride and alkylbenzyldiamethylammonium chloride.

It is desirable for the foregoing surfactants to account for 0.05 to 15 weight %, preferably 0.1 to 5 weight %, of the total solids in the image forming layer.

In the image recording layer, the fluorine-containing surfactants may also be used, if desired, within the limits of the foregoing proportion of the surfactants. Specifically, the surfactants containing perfluoroalkyl groups are used to advantage. Examples of surfactants containing such groups include anionic surfactants containing carboxylic acid, sulfonic acid, sulfate or phosphate, cationic surfactants such as aliphatic amines and quaternary ammonium salts, amphoteric surfactants of betaine type, and nonionic surfactants of polyoxy compound aliphatic ester, polyalkyleneoxide-condensed type or polyethyleneimine-condensed type.

Coating

The coating solution prepared by mixing ingredients selected from the constituents mentioned above is coated on a support by the use of any of conventional coating methods, and dried to be formed into a film.

Examples of conventional coating methods usable herein include bar coater cotaing, spin coating, spray coating, curtain coating, dip coating, air knife coating, blade coating and roll coating methods.

The coverage (on a solids basis) of the image forming layer formed by coating and drying procedures depends on the intended use thereof. In a case of using the image forming layer for a general lithographic printing plate precursor, the suitable coverage of the layer is from 0.1 to 30 g/m², preferably from 0.3 to 10 g/m².

Support

The support on which the image recording layer is provided is illustrated below.

The materials usable as the support is dimensionally stable plate-shaped (or sheet-shaped) materials. Examples of such a support material which can be used in the invention include paper, paper laminated with plastic (such as polyethylene, polypropylene or polystyrene), a metal plate (such as a plate of aluminum, zinc, copper, nickel or stainless steel) a plastic film (such as a film of cellulose diacetate, cellulose triacetate, cellulose propionate, cellulose butyrate, cellulose acetate butyrate, cellulose nitrate, polyethylene terephthalate, polyethylene, polystyrene, polypropylene, polycarbonate or polyvinyl acetal), and paper or a plastic film on which the metal as described above is laminated or deposited.

The support materials preferably used in the invention are polyester films, aluminum plates (or sheets) and SUS steel plates (or sheets) which are hardly corroded during the process of plate-making. In particular, aluminum plates (or sheets) are used to advantage because of their high dimensional stability and relatively low price.

The suitable aluminum plates (or sheets) are a plate (or a sheet) of pure aluminum and plates (or sheets) of alloys containing aluminum as a main component and slight amounts of foreign metals. Further, plastic films on which aluminum is laminated or deposited may be used as support. The foreign metals contained in aluminum alloys are silicon, iron, manganese, copper, magnesium, chromium, zinc, bismuth, nickel and titanium. The proportion of foreign metals in an aluminum alloy is 10 weight % or less. Although the aluminum especially suitable for the invention is pure aluminum, the perfectly pure aluminum is difficult to produce in view of smelting technique. Therefore, even aluminum plates (or sheets) containing trace amounts of foreign metals suffice for supports used in the invention. Thus, the aluminum plate (or sheet) applicable to the invention is not required to have a specific composition, but can be properly chosen from aluminum plates (or sheets) made of conventional materials. The thickness of the support used in the invention is of the order of 0.05–0.6 mm, preferably 0.1–0.4 mm, particularly preferably 0.15–0.3 mm.

Prior to the surface roughening treatment, the aluminum plate (or sheet) undergoes a degreasing treatment with, e.g., a surfactant, an organic solvent or an alkaline aqueous solution for removing the rolling oil from the sheet surface, if desired.

For roughening the aluminum plate (or sheet) surface can be adopted various methods, such as a mechanically roughening method, a method of dissolving and roughening the surface electrochmically and a method of selectively dissolving the surface by chemical treatment. As the mechanically roughening method, well-known methods including a ball graining method, a brush graining method, a blast graining method and a buff graining method can be used. For the chemically roughening method, the method of immersing in a saturated aqueous solution of aluminum salt of mineral acid is well suited. As the electrochemically roughening method, the method of applying the alternating or direct current to an electrolytic solution containing an acid, such as hydrochloric acid or nitric acid, can be employed. In addition, the method of electrolytically roughening the surface by the use of mixed acid as disclosed in JP-A-54-63902 can also be utilized.

Of those surface roughening methods, the combined use of mechanical and electrochemical roughening methods as disclosed in JP-A-55-137993 is preferable, because it can ensure strong adhesiveness of the support to ink-receptive images.

It is desirable that the surface roughening treatment according to any of the above-described methods be performed so that the aluminum sheet surface has a center line average surface roughness (Ra) in the range of 0.3 to 1.0 µm.

The thus surface-roughened aluminum plate (or sheet) is subjected to alkali etching with an aqueous solution of potassium hydroxide or sodium hydroxide, if needed, further to neutralization treatment, and then to anodic oxidation treatment for enhancing the abrasion resistance of the surface, if desired.

The electrolytes usable for the anodic oxidation treatment of aluminum plates (or sheets) include various electrolytes capable of forming a porous oxidation film, such as sulfuric acid, hydrochloric acid, oxalic acid, chromic acid and mixtures of two or more thereof. The electrolyte concentration can be properly chosen depending on the species of electrolyte used.

The conditions for anodic oxidation treatment change variously depending on the electrolyte used, so they cannot be generalized. However, by the normal standards of anodic oxidation, it would be appropriate that the electrolyte concentration be from 1 to 80 weight %, the electrolyte temperature be from 5 to 70° C., the current density be from 5 to 60 ampere/dm$^2$, the voltage be from 1 to 100 V and the electrolysis time be from 10 seconds to 5 minutes.

The suitable amount of oxidation film formed is from 1.0 to 5.0 g/m$^2$, particularly from 1.5 to 4.0 g/m$^2$.

Of those anodic oxidation treatments, the method of performing anodic oxidation in sulfuric acid under a high current density, which is disclosed in U.K. Patent 1,412,768, and the method of using phosphoric acid as electrolytic bath for anodic oxidation, which is disclosed in U.S. Pat. No. 3,511,661, are preferred over the others.

Plate-making Method

The plate-making method for the present lithographic printing plate precursor is illustrated below. The imagewise exposure of the present lithographic printing plate precursor can be performed with any of light sources capable of emitting active rays. Examples of a light source usable herein include various laser devices, such as eximer laser (XeF), He—Cd laser, N$_2$ laser, external resonator type Fourth-HG using the second higher harmonic wave obtained by LD-excited Nd;YAG laser internal resonator type SHG and a BBO crystal, and Q-switch operational LD-excited solid laser; and ultraviolet light sources, such as a xenon discharge lamp, a mercury lamp, a tungsten lamp, a tungsten-halogen lamp, a xenon arc lamp, and a fluorescent lamp.

The images may be written using an area exposure method or a scanning method. In a case of using an area exposure light source, the optimum exposure amount varies with the illumination, but it is generally desirable that the area exposure intensity before modification with images for printing be within the range of 0.1 to 10 J/cm$^2$, preferably 0.1 to 1 J/cm$^2$. When the support used is transparent, the exposure operation can also be carried out from the back side of the support via the support. The exposure time can be selected from a wide range so far as it can ensure the necessary exposure. In general it is desirable to choose the illumination so as to achieve the foregoing exposure intensity by 0.01-msec to 10-minute exposure, preferably 0.01-msec to 1-minute exposure.

In a case of writing images by the use of a scanning method, the printing plate precursor is scanned with laser beams modified with images. Examples of a light source usable in such a scanning method include eximer laser (XeF), He—Cd laser, N$_2$ laser, external resonator type Fourth-HG using the second higher harmonic obtained by LD-excited Nd;YAG laser internal resonator type SHG and a BBO crystal, Q-switch operational LD-excited solid laser and water-cooled argon laser having oscillation wavelengths of from 351.6 to 363.8 nm. Further, the gallium nitride laser devices already confirmed as near ultraviolet oscillators can be employed as light sources, too. Such devices are, e.g., InGa series quantum-well semiconductor laser having oscillation wavelengths of from 360 to 440 nm and waveguide MgO—LiNbO$_3$ inverting domain wavelength conversion device type of laser having oscillation wavelenghts of from 360 to 430 nm. The output of the foregoing laser devices used for scanning exposure can be in the range of 0.1 to 300 W. When the exposure is carried out with a pulse laser device, however, it is effective that the device has the peak output of at least 1000 W, preferably 2000 W. The suitable exposure in these laser-scanning cases is from 0.1 to 10 J/cm$^2$, preferably 0.3 to 1 J/cm$^2$ in terms of the exposure intensity before modification with images for printing. When the support used is transparent, the exposure operation can be carried out from the back side of the support via the support, too.

In making a lithographic printing plate, the so-called gumming step, or the step of coating a burning conditioner containing a plate surface protecting agent (namely a gum solution), is introduced for protecting the non-image areas, if needed. More specifically, the gumming step is carried out for various purposes, e.g., preventing the hydrophilic surface of the lithographic printing plate from undergoing the influences of trace amounts of contaminants in the air to lower its hydrophilicity, heightening the hydrophilicity of the non-image areas, preventing the lithographic printing plate from undergoing deterioration during a period from the conclusion of plate-making to the beginning of printing operations or a period from suspension to resumption of printing operations, preventing the non-image areas from being stained and rendered ink-receptive by adhesion of finger sebum and printing ink upon handling for, e.g., mounting the printing plate on a printing machine, and further preventing both image and non-image areas from getting scratches at the time the printing plate is handled.

Suitable examples of a film-forming water-soluble resin used for the aforementioned purposes include gum arabic, cellulose derivatives (such as carboxymethyl cellulose, carboxyethyl cellulose and methyl cellolose) and modified products thereof, polyvinyl alcohol and derivatives thereof, polyvinyl pyrrolidone, polyacrylamide and acrylmide copolymers, acrylic acid copolymers, vinyl methyl ether/maleic anhydride copolymer, vinyl acetate/maleic anhydride copolymer, styrene/maleic anhydride copolymer, roasted dextrin, enzyme-decomposed dextrin and enzyme-decomposed etherified dextrin.

The suitable proportion of the water-soluble resin as described above in the protecting agent of a burning conditioner is from 3 to 25 weight %, preferably from 10 to 25 weight %.

Additionally, the foregoing water-soluble resins may be used as a mixture of two or more thereof.

To the plate-surface protecting agent, various surfactants can further be added. For instance, anionic surfactants and nonionic surfactants can be used therein. Examples of usable anionic surfactants include sulfuric acid esters of aliphatic alcohols, tartaric acid, malic acid, lactic acid, levulinic acid, organic sulfonic acids, and mineral acids, such as nitric acidd, sulfuric acid and phosphoric acid. At least one among mineral acids, organic acids or inorganic salts, or a combination of two or more thereof may be used as the anionic surfactant.

In addition to the foregoing ingredients, lower polyhydric alcohol such as glycerin, ethylene glycol or triethylene glycol can be used as a wetting, if desired. The suitable proportion of such a wetting in the protecting agent is from 0.1 to 5.0% by weight, preferably from 0.5 to 3.0% by weight. Further, preservatives can be added to the plate surface protecting agent for the present lithographic printing plate. Specifically, benzoic acid or a derivative thereof, phenol, formaldehyde or sodium dehydroacetic acid can be used as a preservative in a proportion of 0.005 to 2.0 weight %.

To the plate surface protecting agent, an antifoaming agent can also be added. Organic silicone compounds are preferred as the antifoaming agent, and it is appropriate for them to be added in a proportion of 0.0001 to 0.1 weight %.

For preventing the lowering of ink receptivity in the image areas, organic solvents can be contained in the plate surface protecting agent. Organic solvents slightly soluble in water are preferably used for the foregoing purpose, and examples thereof include petroleum distillates having boiling points in the range of about 120° C. to about 250° C., and plasticizers having freezing points of no higher than 15° C. and boling points of no lower than 300° C., such as dibutyl phthalate and dioctyl adipate. The organic solvents as recited above can be added in a proportion of 0.05 to 5 weight %.

The plate surface protecting agent can assume any of solution, suspension and emulsion forms. However, the agent can achieve its effect to the full when the agent assumes an emulsion form containing organic solvents as mentioned above. In this case, as disclosed in JP-A-55-10581, it is desirable that the surfactants be contained in combination with the organic solvents.

The plate made by subjecting the printing plate precursor to imagewise exposure and, if needed, gumming treatment is mounted on a printing machine, and undergoes printing operations. In another way, the plate precursor is mounted on a printing machine just after imagewise exposure (without undergoing development-processing), and subjected to printing operations. In still another way, the plate precursor is mounted on a printing machine, and undergoes imagewise exposure by the scan with laser beams to be made into a lithographic printing plate on the printing machine. In other words, the present lithographic printing plate precursor can be made into a lithographic printing plate without expressly undergoing development-processing.

Now, the invention will be illustrated in more detail by reference to the following examples, but these examples should not be construed as limiting the scope of the invention in any way.

EXAMPLE 1

A water-based coating composition constituted of the following ingredients was prepared by 10-minute dispersion with a paint shaker, coated on a 180 $\mu$m-thick PET base having a corona-processed surface at a coverage of 22.5 ml/m$^2$ by the use of a bar coater, and then dried for 10 minutes in an oven kept at 100° C., thereby forming a photosensitive plate precursor. The hydrophilic layer of this plate precursor had a dry coverage of 3.0 g/m$^2$.

| Coating Composition | |
|---|---|
| Titanium dioxide powder (produced by Wako Pure Chemical Industries Ltd., rutile type, average grain diameter: 0.2 $\mu$m) | 3.1 g |
| PVA 117 (produced by Kuraray Co., Ltd., 10% aqueous solution) | 10.1 g |
| 20% Aqueous solution of silica gel dispersion | 6.0 g |
| Glyoxal | 0.8 g |
| Water | 20.6 g |

The waterdrop contact angle with the surface of the thus formed photosensitive printing plate precursor was 53 degrees.

<Imagewise Exposure>

The printing plate precursor thus formed was immersed in a one normal aqueous solution of silver nitrate, and then subjected to 20-second imagewise irradiation using a developed lith film original as a mask and a 100 W high-pressure mercury lamp under a condition that the light of short wavelengths were cut by Pyrex glass. Thus, the black metal silver was deposited on the surfaces of titanium dioxide grains present in the irradiated areas. The irradiated area surface of the thus made printing plate had a waterdrop contact angle of 0 degree. This indicates that the irradiated area surface was converted into a very highly hydrophilic surface On the other hand, no change was produced in the waterdrop contact angle with the unirradiated area surface. Thus, the imagewise pattern of clear distribution for hydrophobicity and hydrophilicity was formed by the irradiated and unirradiated areas.

EXAMPLE 2

A water-based coating composition constituted of the ingredients described below was prepared as a dispersion by 10-minute high-speed agitation with a paint shaker, coated on a 180 $\mu$m-thick PET base having a corona charging-processed surface at a coverage of 12.5 ml/m$^2$ by the use of a bar coater, and then dried for 10 minutes in an oven kept at 100° C., thereby forming a photosensitive plate precursor. The hydrophilic layer of this plate precursor had a dry coverage of 3.0 g/m$^2$.

| Coating Composition | |
|---|---|
| Titanium dioxide powder (produced by Wako Pure Chemical Industries Ltd., rutile type) | 3.1 g |
| PVA 117 (produced by Kuraray Co., Ltd., 10% aqueous solution) | 3.5 g |
| 20% Aqueous solution of silica gel dispersion | 6.0 g |
| Sol-gel solution | 2.4 g |
| Water | 7.5 g |
| Sol-Gel Solution | |
| Tetraethoxysilane | 7.5 g |
| Mercaptopropyltriethoxysilane | 8.6 h |
| Ethanol | 32.5 g |
| One-tenth normal nitric acid | 4.5 g |

The waterdrop contact angle with the surface of the thus formed photosensitive printing plate precursor was 72 degrees.

<Imagewise Exposure>

The printing plate precursor thus formed was immersed in a one normal aqueous solution of silver nitrate, and then subjected to 20-second imagewise irradiation using a developed lith film original as a mask and a 100 W high-pressure mercury lamp under a condition that the light of short wavelengths were cut by Pyrex glass. Thus, the black metal silver was deposited on the surfaces of titanium dioxide grains present in the irradiated areas. The waterdrop contact angle with the irradiated area surface of the thus made printing plate showed spreading wetting (i.e., extended wetting). This indicates that the irradiated area surface was converted into a very highly hydrophilic surface. On the other hand, no change was produced in the waterdrop contact angle with the unirradiated area surface. Thus, the imagewise pattern of clear distribution for hydrophobicity and hydrophilicity was formed by the irradiated and unirradiated areas.

EXAMPLE 3

A water-based coating composition constituted of the ingredients described below was prepared as a dispersion by 10-minute high-speed agitation with a paint shaker, coated on a 180 μm-thick PET base having a corona charging-processed surface at a coverage of 12.5 ml/m² by the use of a bar coater, and then dried for 10 minutes in an oven kept at 100° C., thereby forming a photosensitive plate precursor. The hydrophilic layer of this plate precursor had a dry coverage of 3.0 g/m².

| Coating Composition | |
|---|---|
| Titanium dioxide powder (produced by Wako Pure Chemical Industries Ltd., rutile type, average grain diameter: 0.2 μm) | 3.1 g |
| 10% Aqueous solution of polyacrylic acid | 10.1 g |
| 20% Aqueous solution of silica gel dispersion | 6.0 g |
| Tetraethylene glycol diglycidyl ether | 0.2 g |
| Water | 20.6 g |

The waterdrop contact angle with the surface of the thus formed photosensitive printing plate precursor was 52 degrees.

<Imagewise Exposure>

The printing plate precursor thus formed was immersed in a one normal aqueous solution of silver nitrate, and then subjected to 20-second imagewise irradiation using a developed lith film original as a mask and a 100 W high-pressure mercury lamp under a condition that the light of short wavelengths were cut by Pyrex glass. Thus, the black metal silver was deposited on the surfaces of titanium dioxide grains present in the irradiated areas. The waterdrop contact angle on the irradiated area surface of the thus made printing plate showed spreading wetting. This indicates that the irradiated area surface was converted into a very highly hydrophilic surface. On the other hand, no change was produced in the waterdrop contact angle with the unirradiated area surface. Thus, the imagewise pattern of clear distribution for hydrophobicity and hydrophilicity was formed by the irradiated and unirradiated areas.

EXAMPLE 4

A water-based coating composition constituted of the following ingredients was prepared by 10-minute dispersion with a paint shaker, coated on a 180 μm-thick PET base having a corona-processed surface at a coverage of 22.5 ml/m² by the use of a bar coater, and then dried for 10 minutes in an oven kept at 100° C., thereby forming a silver nitrate-containing printing plate precursor according to the invention. The hydrophilic layer of this plate precursor had a dry coverage of 3.0 g/m².

| Coating Composition | |
|---|---|
| Titanium dioxide powder (produced by Wako Pure Chemical Industries Ltd., anataze type, average grain diameter: 0.15 μm) | 3.1 g |
| PVA 117 (produced by Kuraray Co., Ltd., 10% aqueous solution) | 10.1 g |
| 20% Aqueous solution of silica gel dispersion | 6.4 g |
| Glyoxal | 0.4 g |
| One normal aqueous solution of silver nitrate | 11.2 g |
| Water | 23.9 g |

The waterdrop contact angle on the surface of the thus formed photosensitive plate precursor was 57 degrees.

Then, the plate precursor thus formed was subjected to 30-second irradiation with a 100 W high-pressure mercury lamp under a condition that the light of short wavelengths were cut by Pyrex glass. As a result, the black metal silver was deposited on the surfaces of titanium dioxide grains present in the irradiated areas. The irradiated area surface of the thus made printing plate had a waterdrop contact angle of 0 degree. This indicates that the irradiated area surface was converted into a very highly hydrophilic surface. Thus, the imagewise pattern of clear distribution for hydrophobicity and hydrophilicity was formed by the irradiated and unirradiated areas.

EXAMPLE 5

Images were written on the same printing plate precursor as prepared in Example 4 by direct exposure using a writing machine equipped with He—Cd laser as a light source (10 mW, beam diameter 20 μum, drum form) at a writing speed of 30 mm/sec.

The thus made printing plate was mounted on a printing machine RYOBI-3200MCD, and underwent ordinary printing operations using a 1 vol % aqueous solution of EU-3 (produced by Fuji Photo Film Co., Ltd.) as a fountain solution and black ink GEOS (N). Good print having uniform inking in both halftone and solid areas and no staining in the non-image area was obtained on the tenth sheet after beginning the printing operations. Further, 10,000 sheets of stain-free, high-quality prints were obtained.

EXAMPLE 6

A photosensitive printing plate precursor was formed in the same manner as in Example 1, except that the titanium dioxide used in Example 1 was replaced by zinc oxide (average grain diameter: 0.15 μm). The waterdrop contact angle with the surface of the thus prepared plate precursor was 58 degrees. This plate precursor was made into a printing plate in the same manner as in Example 1, immersed in a one normal aqueous solution of silver nitrate, and subjected to imagewise irradiation. As a result, the waterdrop contact angle with the irradiated area surface of the printing plate became 0 degree. This indicates that the irradiated area surface was converted into a very highly hydrophilic surface.

EXAMPLE 7

A water-based coating composition constituted of the following ingredients was prepared through 60-minute stirring, coated on an aluminum substrate having an anodized surface by means of a bar coater so as to have a dry coverage of 1.0 g/m², and then dried for 10 minutes in an oven kept at 100° C. Further, the coated layer was heated at 120° C. for 30 minutes. Thus, the silver nitrate-containing lithographic printing plate precursor was formed.

| Coating Composition | |
|---|---|
| 30% Aqueous dispersion of photocatalytic titanium dioxide sol (STS-01, trade name, a product of Ishihara Sangyo Kaisha, Ltd.) | 121.9 g |
| 10% Aqueous solution of PVA 117 (produced by Kuraray Co., Ltd.) | 10.1 g |
| Colloidal silica (20% dispersion) (Snowtex C, trade name, a product of Nissan Chemicals Industries, Ltd.) | 6.4 g |
| Methyltrimethoxysilane | 36.5 g |
| One normal aqueous solution of silver nitrate | 31.1 g |
| Methanol | 208.1 g |

The waterdorp contact angle with the surface of the photosensitive plate precursor was 76 degrees.

Then, this plate precursor underwent 30-second imagewise exposure in the same manner as in Example 4. As a result, the waterdrop contact angle with the exposed area surface of the printing plate became 0degree. This indicates that the exposed area surface was converted into a very highly hydrophilic surface.

EXAMPLE 8

A water-based coating composition constituted of the following ingredients was prepared, coated on an aluminum substrate having an anodized surface by means of a bar coater so as to have a dry coverage of 2.0 g/m², and then dried for 10 minutes in an oven kept at 100° C., thereby forming a go lithographic printing plate precursor according to the invention.

| Coating Composition | |
|---|---|
| Titanium dioxide powder (produced by Wako Pure Chemical Industries Ltd., rutile type, average grain diameter: 0.2 μm) | 3.1 g |
| 10% Aqueous solution of PVA 117 (produced by Kuraray Co., Ltd.) | 2.0 g |
| 20% Aqueous solution of silica gel dispersion | 6.0 g |
| Glyoxal | 0.8 g |
| Acrylate latex AE130 (produced by JSR Co., Ltd.) | 2.3 g |
| Water | 20.6 g |

The waterdrop contact angle with the surface of the thus formed photosensitive printing plate precursor was 82 degrees. Then, this plate precursor underwent 60-second imagewise exposure in the same manner as in Example 1. As a result, the waterdrop contact angle with the exposed area surface of the printing plate became 0 degree. This indicates that the exposed area surface was converted into a very highly hydrophilic surface.

EXAMPLE 9

A 100 micron-thick polyethylene terephthalate (PET) film was placed in a vacuum evaporation apparatus, and thereonto a titanium dioxide thin film was evaporated by heating a titanium metal piece under the condition that the total pressure was $1.5 \times 10^{-4}$ Torr and the partical pressure of oxygen gas was 70%. By the X-ray analysis, the crystal structure of the thus formed thin film was found to have a amorphous/anataze/rutile ratio of 1.5/6.5/2. And the thickness of the $TiO_2$ thin film was 900 angstrom.

Then, a water-based coating composition constituted of the following ingredients was prepared by 10-minute dispersion with a paint shaker, coated on the foregoing titanium dioxide thin film provided on the PET film base at a coverage of 4.8 ml/m² by means of a bar coater, and then dried for 10 minutes in an oven kept at 100° C., thereby forming a photosensitive plate precursor. The hydrophilic layer of this plate precursor had a dry coverage of 0.3 g/m².

| Coating Composition | |
|---|---|
| 10% Aqueous solution of PVA 117 (produced by Kuraray Co., Ltd.) | 10.1 g |
| 20% Aqueous solution of silica gel dispersion | 6.0 g |
| Glyoxal | 0.8 g |
| Water | 20.6 g |

The waterdrop contact angle with the surface of the thus formed photosensitive printing plate precursor was 53 degrees.

<Imagewise Exposure>

The printing plate precursor thus formed was immersed in a one normal aqueous solution of silver nitrate, and then subjected to 20-second imagewise irradiation using a developed lith film original as a mask and a 100 W high-pressure mercury lamp under a condition that the light of short wavelengths were cut by Pyrex glass. Thus, the black metal silver was deposited on the surfaces of titanium dioxide crystals present in the irradiated areas. The waterdrop contact angle with the irradiated area surface of the thus made printing plate was 5 degrees. This indicates that the irradiated area surface was converted into a highly hydrophilic surface. On the other hand, no change was produced in the waterdrop contact angle with the unirradiated area surface. Thus, the imagewise pattern of clear distribution for hydrophobicity and hydrophilicity was formed by the irradiated and unirradiated areas.

EXAMPLE 10

A water-based coating solution having the same composition as in Example 7 was prepared by 10-minute dispersion with a paint shaker, coated on a 180 μm-thick PET film base having a corona-processed surface at a coverage of 45 ml/m²by means of a bar coater, and then dried for 10 minutes in an oven kept at 100° C., thereby forming a photosensitive plate precursor. The hydrophilic layer of this plate precursor had a dry coverage of 6.0 g/m².

Then, images were written on this photosensitive material by direct exposure using a writing machine equipped with He—Cd laser as a light source (10 mW, beam diameter 20 μm, drum form) at a drawing speed of 30 mm/sec. Thus, the transmission density of the image area was 3.2 (the measurement thereof was carried out using a densitometer having the optical system defined by the International Standards ISO5 (X-RITE densitometer) via a whole visible region neutral color filter). On the other hand, the non-exposed area had the transmission density of 0.05. This indicates that the non-image area had great discrimination against the exposed area. Thus, a lith film original having great discrimination in transmission density was obtained.

COMPARATIVE EXAMPLE 1

Be fore undergoing imagewise exposure, the same printing plate precursor as formed in Example 1, wherein titanium dioxide grains were contained, was immersed in distilled water instead of one normal aqueous solution of silver nitrate used in Example 1. Then, the resultant plate precursor was subjected to the same ultraviolet irradiation as in Example 1. Therein, the relation between irradiation times and waterdrop contact angles with the irradiated area surface was examined. Examination result obtained herein was compared with that obtained under the irradiation condition adopted in Example 1. These irradiation time-waterdrop contact angle relations are shown in the following table. As is apparent from the following table, the presence of silver ions as a reducible material made it possible to effectively convert the precursor surface into hydrophilic one.

| Irradiation time | 0 sec | 10 sec | 20 sec | 30 sec | 60 sec | 5 min | 10 min | 30 min | 60 min |
|---|---|---|---|---|---|---|---|---|---|
| Example 1 | 53° | 35° | 0° | 0° | 0° | 0° | 0° | 0° | 0° |
| Comparative Example 1 | 53° | 53° | 53° | 54° | 52° | 50° | 49° | 33° | 0° |

EFFECT OF THE INVENTION

By employing printing plate precursors according to the invention and the present printing method in which the lithographic printing plate precursor having on a support a layer comprising an oxidizable material and a reducible material is subjected to imagewise irradiation in the presence of a metal compound having a hydrophobic surface and a photocatalytic property to form an imagewise distribution of hydrophilicity and hydrophobicity and then to printing operations, the discrimination between the image area and the non-image area is improved and the printing of high quality, e.g., an excellent press life and almost no staining, becomes possible. In a case of using as the reducible material the salt of a metal element situated behind hydrogen in the order of a ionization tendency and in a case of using titanium dioxide or zinc oxide as a photocatalytic metal compound, the invention can achieve especially marked effects. Further, the invention can provide a lithographic printing plate precursor in which image information can be recorded with an active ray-emitting laser device to be made into a printing plate directly from digital data.

While the invention has been described in detail and with reference to specific embodiment thereof, it will be apparent to one skilled in the art that various changes and modifications can be made therein without departing from the spirit and scope thereof.

What is claimed is:

1. A method of producing a lithographic printing plate; comprising a step of providing on a support a layer that has a hydrophobic surface and comprises an oxidizable material and a reducible material wherein the reducible material is a salt of a metal element situated behind hydrogen in the order of ionization tendency, and a step of irradiating out imagewise with active rays in the presence of a photocatalytic metal compound, wherein the oxidizable material in the irradiated area is decomposed imagewise to convert the layer surface in the irradiated area surface into hydrophilic property and form an imagewise distribution of hydrophilic areas and hydrophobic areas.

2. A method of producing a lithographic printing plate comprising a step of providing on a support a layer that has a hydrophobic surface and comprises an oxidizable material and a reducible material wherein the reducible material is a salt of a metal element situated behind hydrogen in the order of ionization tendency, and a step of irradiating out imagewise with active rays in the presence of a photocatalytic metal compound wherein the photocatalytic metal compound is dispersed in the state of grains in the layer comprising an oxidizable material and a reducible material, or provided in the form of a thin film so as to be in contact with the layer comprising an oxidizable material and a reducible material and, wherein the oxidizable material in the irradiated area is decomposed imagewise to convert the layer surface in the irradiated area surface into hydrophilic property and form an imagewise distribution of hydrophilic areas and hydrophobic areas.

* * * * *